(12) United States Patent
Guo et al.

(10) Patent No.: US 7,833,581 B2
(45) Date of Patent: Nov. 16, 2010

(54) METHOD FOR MAKING A HIGHLY STABLE DIAMOND FILM ON A SUBSTRATE

(75) Inventors: Liang Guo, North Point (HK); Guohua Chen, Kowloon (HK)

(73) Assignee: The Hong Kong University of Science and Technology, Hong Kong (CN)

( * ) Notice: Subject to any disclaimer, the term of this patent is extended or adjusted under 35 U.S.C. 154(b) by 296 days.

(21) Appl. No.: 11/898,112

(22) Filed: Sep. 10, 2007

(65) Prior Publication Data

US 2008/0070049 A1   Mar. 20, 2008

Related U.S. Application Data

(60) Provisional application No. 60/843,172, filed on Sep. 11, 2006.

(51) Int. Cl.
*C23C 16/00* (2006.01)
(52) U.S. Cl. ............. 427/249.8; 427/249.7; 427/249.11
(58) Field of Classification Search ............. 427/249.7, 427/249.8
See application file for complete search history.

(56) References Cited

U.S. PATENT DOCUMENTS

| 4,919,974 | A | * | 4/1990 | McCune et al. | ........... 427/249.7 |
| 5,146,481 | A | * | 9/1992 | Garg et al. | .................... 378/35 |
| 5,183,529 | A | * | 2/1993 | Potter et al. | .................... 264/81 |
| 5,225,245 | A | * | 7/1993 | Ohta et al. | .............. 427/248.1 |
| 5,587,013 | A |   | 12/1996 | Ikegaya et al. | |
| 6,066,399 | A | * | 5/2000 | Hirano et al. | ............... 428/408 |
| 6,319,439 | B1 |   | 11/2001 | Lee et al. | |
| 6,981,465 | B2 | * | 1/2006 | Chae | .................... 118/723 HC |
| 2001/0005111 | A1 | * | 6/2001 | Patterson et al. | ............ 313/310 |
| 2002/0001717 | A1 | * | 1/2002 | Hanyu | ........................ 428/408 |
| 2003/0064225 | A1 | * | 4/2003 | Ohashi et al. | ............... 428/408 |
| 2004/0180205 | A1 | * | 9/2004 | Scarsbrook et al. | ......... 428/408 |
| 2005/0041374 | A1 | * | 2/2005 | Seitz et al. | ................... 361/516 |
| 2005/0069709 | A1 | * | 3/2005 | Lev et al. | .................... 428/408 |
| 2005/0186345 | A1 |   | 8/2005 | Shibata et al. | |
| 2006/0144702 | A1 | * | 7/2006 | Seki et al. | ................... 204/280 |

FOREIGN PATENT DOCUMENTS

WO    WO 2004/104272    * 12/2004

* cited by examiner

*Primary Examiner*—Timothy H Meeks
*Assistant Examiner*—Joseph Miller, Jr.
(74) *Attorney, Agent, or Firm*—The Nath Law Group; Matthew J. Moffa; Jerald L. Meyer

(57) ABSTRACT

A method of depositing a stable diamond film on a metal substrate includes pretreating a surface of the substrate and depositing a diamond film on the substrate by way of a multi-stage chemical vapor deposition, in which each subsequent stage is performed at progressively higher temperature. The deposited diamond may be doped with boron. The substrate may be titanium, a titanium alloy, iron, an iron alloy, or any other valve metal. The diamond deposition may be a high temperature chemical vapor deposition. The first deposition stage may optionally create a carbide of diamond and substrate, and an optional mixture of diamond and amorphous carbon may be deposited to bond this carbide layer to a subsequently applied layer. The resulting product may be used as an electrode, as a tooth or blade in a cutting tool, or may have many other uses.

13 Claims, 13 Drawing Sheets

METHOD FOR MAKING A HIGHLY STABLE DIAMOND FILM ON A SUBSTRATE

CROSS-REFERENCE TO RELATED APPLICATIONS

This application claims the benefit of U.S. Provisional Patent Application No. 60/843,172, filed Sep. 11, 2006, the contents of which are hereby incorporated by reference in their entirety.

BACKGROUND OF THE INVENTION

1. Field of the Invention

The present disclosure relates to the preparation of diamond films, and in particular, to the methods of deposition of diamond on valve metal substrates.

2. Related Art

High quality diamond film has become an attractive electrode material in electrochemical research and in various applications. As an example, diamond film electrodes can sustain redox reactions with more positive or negative standard potentials than those of water split, such as those with large over potentials like the evolution of chlorine, oxygen and hydrogen gases. As another example, diamond film electrodes can support the degradation of various refractory pollutants with high current efficiency, such as ammonia, cyanide, phenol, chlorophenols, aniline, TCE, various dyes, surfactants, and landfill leachate. These applications are discussed in the following articles: R. Tenne et al, J. Electroanal. Chem. 347, 409, (1993); J. Iniesta et al, Electrochem. Commun. 3, 346, (2001); X. Chen et al, Environ. Sci. Technol. 37, 5021, (2003); I. Troster et al, Diamond Relat. Mater. 11, 640, (2002); X. Chen et al, Chem. Eng. Sci. 58, 995, (2003). Moreover, diamond electrodes provide a low and stable background current, which has led to their use in the electroanalytical field.

Methods for diamond film deposition on nondiamond substrates include hot-filament chemical vapor deposition (HFCVD) and microwave plasma assisted chemical vapor deposition (MWPACVD). For these known CVD methods, low pressure (13.3-133 mbar) and high substrate temperature (600-1000° C.) are typically necessary. Commonly, these CVD methods take place in a hydrogen gas environment, which includes gases such as hydrocarbon chemicals, especially methane gas. Hydrogen molecules are decomposed into atomic hydrogen under the high energy input to the CVD system, such as the thermal energy from the filament in HFCVD system and plasma energy in MWPACVD system. The hydrogen radicals play multiple and critical roles during the process of diamond formation, and work as the main reactants and the energy source for the reactions. Low pressure in the system prolongs the retention time and increases the mean free path of the radicals produced in the gas phase. The high substrate temperature provides the energy for the surface reaction to form diamond crystals.

Some methods are known for depositing diamond film on various nondiamond substrates, including titanium, with CVD methods, but these are all problematic. In the methods using a titanium substrate, due to the high substrate temperature and the large difference of the thermal expansion coefficient between diamond and titanium, the diamond and substrate experience nearly a 7 GPa thermal stress under a substrate temperature of 1170 K. Further, in these methods, intrinsic stress results from structural mismatches, such as different lattice constant between the deposited diamond film and the substrate. Moreover, residual stress in the film, resulting from thermal stress and intrinsic stress, will reduce adhesion of the diamond film to the substrate, and may even cause the diamond film to peel away from the substrate during the cooling process after deposition. Accordingly, stability of the diamond film electrode is of the highest concern, and has impeded its widespread utilization.

U.S. Patent Application Publication No. 2005/0186345 suggests a pre-treatment process to obtain a uniform and high density nucleus with good reproducibility. The process includes the consecutive processes of blasting with ceramic particles, surface cleaning with an acid or base wash, heat treatment in vacuum or inert atmosphere, and ultrasonic scratching in nanodiamond particles. It is believed that these pre-treatment steps allow the formation of interlayers between the film and substrate during coating of the substrate by CVD, PVD, sputtering, or plating methods. These interlayers ideally have only small thermal coefficient differences and lattice constant differences between themselves and their adjacent layers, and thus play a positive role in improving the adhesion of the diamond film with the substrate. However, this technique is problematic. Particularly, the final pretreatment process of ultrasonic scratching with high hardness particles can leave the coated interlayer removable. Loss of the interlayer leads to peeling of the superficial film, causing the electrode to stop functioning. Further, this technique does not account for the thickness and porosity of the interlayers being formed, where think and porous interlayers are known to reduce adhesion of film to substrate. Additionally, this technique only attends to the formation of an interlayer between the diamond film and substrate, and not to the formation of useful interlayers of varying degrees of diamond content.

U.S. Pat. No. 5,587,013 is drawn to a technique for reducing residual stress between a diamond film and substrate, but this technique too is problematic. The technique involves alternately growing a potential-concave diamond layer (substrate temperature of 880° C. to 950° C. and a hydrocarbon ratio of 2.5 vol % to 3.5 vol %) and a potential-convex diamond layer (substrate temperature of 800° C. to 850° C. and a hydrocarbon ration of 0.5 vol % to 1.5 vol %). This technique fails to improve adhesion at the substrate surface, ignores the formation and nature of any interlayers, and further provides poor superficial diamond quality when the substrate temperature is reduced.

Similarly, U.S. Pat. No. 6,319,439 is drawn to a technique for compensating the intrinsic tensile stress of a diamond film with a step down control of the deposition temperature during deposition. Again, this technique fails to improve adhesion at the substrate surface, ignores the formation and nature of any interlayers, and further provides poor superficial diamond quality when the substrate temperature is reduced.

Thus, all of the known methods for vapor deposition of diamond films fail to provide both a superior superficial diamond quality and a strong adhesion to an underlying substrate.

SUMMARY OF THE INVENTION

The present subject matter addresses the above concerns by teaching the following methods and apparatuses.

The present disclosure includes a method of depositing a stable diamond film on a substrate. The method includes providing a metal substrate, pretreating the substrate surface, and placing the substrate in a reaction chamber. A diamond film is then deposited on the substrate by way of a 2-10 stage chemical vapor deposition method. First, the substrate temperature is increased from a starting temperature ($T_S$) to a first stage temperature ($T_1$) in a set period of time ($ti_1$). Then, while the substrate is kept at the first stage temperature ($T_1$) for a period of working time ($t_1$), diamond, optionally accompanied by other elements or materials, is deposited on the pretreated surface of the substrate. Then for each further deposition stage, the substrate temperature is increased to a higher temperature ($T_n$) over another period of time ($ti_n$), and then while the substrate is kept at the n-th stage temperature ($T_n$) for a further period of working time ($t_n$), diamond, optionally accompanied by other elements or materials, is deposited. After deposition, the substrate and the diamond film are cooled for a period of cooling time ($ti_f$).

A total number of stages N may be performed, such that N can range from 2 to 10 stages. Accordingly, the step index n increases from 2 to N. These are non-limiting examples, however, and more than N=10 stages may occur.

In some aspects, each time $ti_n$ is selected from the range of about 1 minute to 30 minutes. This is a non-limiting example, however, and other ranges may be used. For example, each time $ti_n$ may be selected from the range of about 1 minute to 20 minutes, from the range of about 5 minutes to 30 minutes, from the range of about 30 seconds to 30 minutes, or from the range of about 1 minute to 60 minutes.

In some aspects, each time $t_n$ is selected from the range of about 1 to 10 hours. This is a non-limiting example, however, and other ranges may be used. For example, each time $t_n$ may be selected from the range of about 1 to 5 hours, from the range of about 2 to 10 hours, from the range of about 30 minutes to 10 hours, or from the range of about 1 to 20 hours.

In some aspects, each substrate temperature $T_n$ is selected from the range of about 300-1000° C. This is a non-limiting example, however, and other ranges may be used. For example, each substrate temperature $T_n$ may be selected from the range of about 300-800° C., from the range of about 400-1000° C., from the range of about 100-1000° C., or from the range of about 300-1200° C.

In some aspects, each temperature difference between each temperature $T_n$ and its subsequent temperature $T_{n+1}$ is selected from the range of about 50-300° C. This is a non-limiting example, however, and other ranges may be used. For example, each temperature difference between each temperature $T_n$ and its subsequent temperature $T_{n+1}$ may be selected from the range of about 50-200° C., from the range of about 100-300° C., from the range of about 20-300° C., or from the range of about 50-400° C.

In some aspects, the cooling occurs at a cooling rate from the range of about 0.5-10° C./min. This is a non-limiting example, however, and other ranges may be used. For example, the cooling may occur at a cooling rate from the range of about 2-10° C./min, from the range of about 0.5-5° C./min, from the range of about 0.2-10° C./min, or from the range of about 0.5-20° C./min.

In some aspects, reaction chamber pressure is kept in the range of about 20-120 mbar, gas flow rate in the reaction chamber is kept in the range of about 100-500 SCCM, and the hydrocarbon gas to hydrogen gas ratio is kept in the range of about 0.3 vol %-3 vol %. These are non-limiting examples, however, and other ranges may be used.

In some aspects, the substrate is titanium, a titanium alloy, or combinations of these. In some aspects, the substrate is more generally a valve metal. In some aspects, the substrate is tantalum, a tantalum alloy, tungsten, or a tungsten alloy.

In some aspects, the pretreatment process includes polishing, ultrasonic scratching with a diamond paste, surface cleaning, ultrasonic washing, or combinations of these.

In some aspects, at least some of the diamond deposited on the film is doped with boron. This is a non-limiting example, however, and other dopants may be used.

In some aspects, a first-stage temperature and time are together selected to produce a dense, thin distribution of a carbide of metal of the metal substrate, and a final stage temperature and time are together selected to produce a diamond layer having a crystal size of less than 2 μm.

In some aspects, the deposition step includes at least two stages. A first-stage temperature and time are together selected to produce a carbide of metal of the metal substrate, and a later-stage temperature and time are together selected to produce a layer of diamond and nondiamond carbon which adhesively joins the carbide layer with the superficial diamond.

In some aspects, the depositing step is performed by way of hot-filament chemical vapor deposition.

In some aspects, the substrate and the diamond film together form an electrode. Such an electrode is advantageous in electrolysis for wastewater treatment, and in the electrochemical analysis of pollutants in water. In other aspects, the substrate and the diamond film together form a tooth or blade configured for use in a cutting tool. These are non-limiting examples, and other structures with an advantageous diamond coating may be made according to the presently disclosed methods.

In at least one aspect, the metal substrate includes titanium, the starting temperature $T_S$ is room temperature, the deposition step has two stages, $T_1$ is about 650° C., $t_1$ is about 5 hours, $T_2$ is about 750° C., $t_2$ is about 5 hours, and the depositing step is performed by way of hot-filament chemical vapor deposition.

The present disclosure is also drawn to a diamond film coated electrode. The electrode includes a metal substrate, a top layer of diamond and optional other elements, and at least one buffer layer between the metal substrate and the top layer. The buffer layer includes a mixture of diamond and amorphous carbon.

In some aspects, the electrode also includes an interlayer. The interlayer includes a carbide compound of carbon and of metal of the metal substrate. The interlayer is between the buffer layer and the substrate. The buffer layer adhesively joins the interlayer to the top layer.

In some aspects, the metal substrate may include titanium, titanium alloy, iron, iron alloy, or combinations of these.

In some aspects, the electrode has a compositionally graded metal structure. This structure may or may not have distinct layers.

In some aspects, the top layer of the electrode includes boron-doped diamond.

BRIEF DESCRIPTION OF THE DRAWINGS

The features, nature, and advantages of the presently disclosed methods and apparatuses will become more apparent from the detailed description set forth below when taken in conjunction with the drawings in which like reference characters identify corresponding items throughout.

DETAILED DESCRIPTION

The present disclosure includes a method of depositing a stable diamond film on a substrate, in a manner which forms one or more interlayers between the substrate and the superficial diamond layer. Interlayer performance is controlled by adjusting reaction conditions, to provide superior superficial diamond quality and strong adhesion to an underlying substrate. Prior to diamond deposition, a carbide layer can be deposited on the metal substrate, if the metal substrate has a high carbon affinity, such as Ti, Ta, W, and other metals or alloys. Properties of the carbide layer may be adjusted by adjusting the reaction conditions. Not all carbide layers are sufficient as a buffer to increase the adhesion of the diamond on the metal substrate. Accordingly, reaction conditions can be adjusted to avoid a rough and porous carbide layer, which would otherwise severely reduce adhesion. Although to some extent the thickness of the carbide layer can also be changed with the adjustment of the hydrocarbon chemical content in the gas phase, morphology as well as thickness of the carbide layer on the metals, especially for titanium, can be more sensitively adjusted by adjusting substrate temperature.

Figure 1:
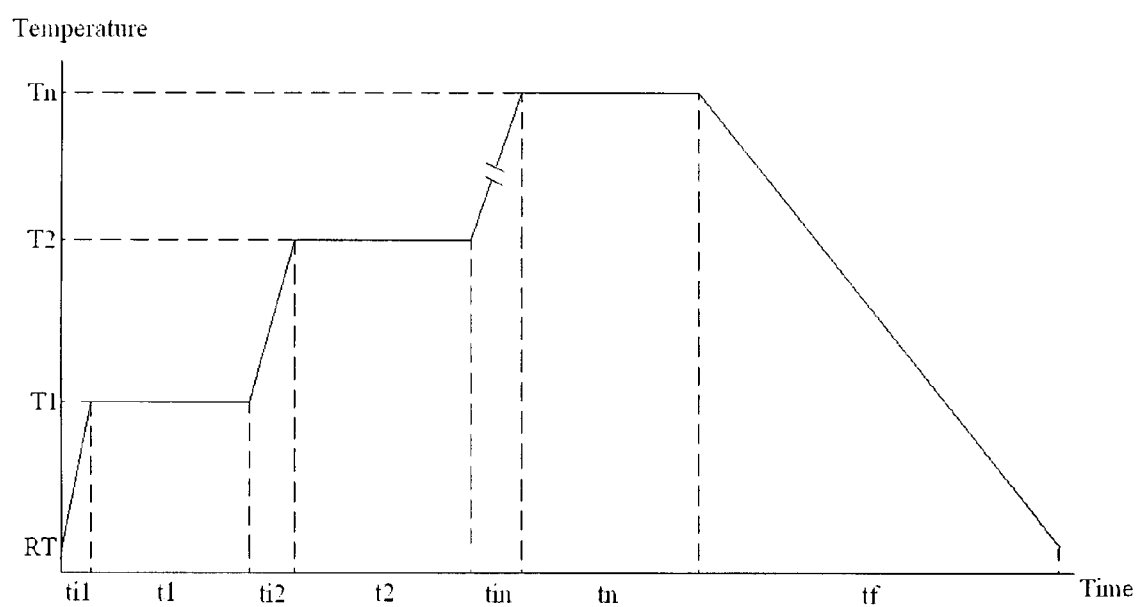
FIG. 1 is a schematic diagram illustrating a multi-stage deposition process according to the present disclosure.

Accordingly, the presently disclosed method makes use of a 2-10 stage chemical vapor deposition process. First, the substrate temperature is increased from a starting temperature ($T_S$) to a first stage temperature ($T_1$) in a set period of time ($ti_1$). Then, while the substrate is kept at the first stage temperature ($T_1$) for a period of working time ($t_1$), diamond, optionally accompanied by other elements or materials, is deposited on the pretreated surface of the substrate. Then for each further deposition stage, the substrate temperature is increased to a higher temperature ($T_n$) over another period of time ($ti_n$), and then while the substrate is kept at the n-th stage temperature ($T_n$) for a further period of working time ($t_n$), diamond, optionally accompanied by other elements or materials, is deposited. After deposition, the substrate and the diamond film are cooled for a period of cooling time ($t_f$). A total number of stages N may be performed, such that N can range from 2 to 10 stages. Accordingly, the step index n increases from 2 to N. This method is schematically illustrated in FIG. 1, which will be discussed in more detail below.

Figure 2A:
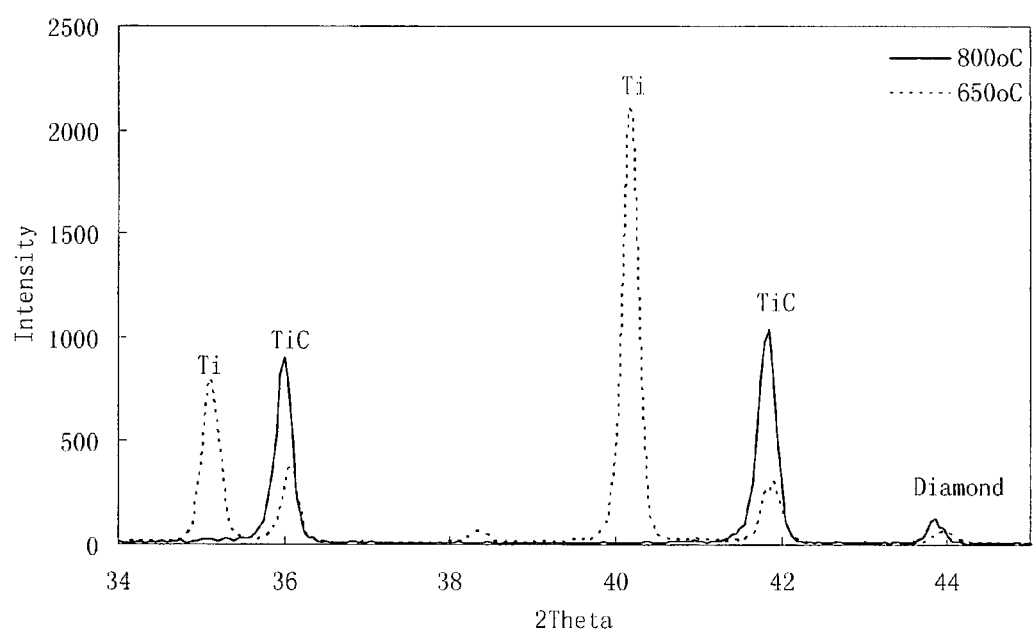
FIG. 2A is an X-ray Diffraction (XRD) pattern of diamond films deposited according to a constant temperature method.

To better illustrate how substrate temperature affects bonding of an applied film, FIG. 2A shows an X-ray Diffraction (XRD) pattern of diamond films deposited according to a constant temperature method. The diamond film was deposited on titanium under substrate temperatures of 650° C. and 800° C. XRD can give us the quantitative information about each phase. It has been shown that titanium carbide (TiC) was formed as the interlayer between the deposited diamond layer and the substrate. Under 800° C., the TiC peaks are much stronger than under 650° C. Results consistent with these XRD analyses were found in cross sectional SEM images, which are not shown here. Under 800° C., the TiC layer was thick, rough and porous compared with under 650° C. Performance of the carbide interlayer was significantly influenced by the substrate temperature. As discussed in the prior art, rough and porous interlayers can reduce adhesion of the deposited diamond film. Therefore, carbide interlayers formed under relatively high temperature such as 800° C. directly on the Ti substrate can have disadvantages, as they could reduce the adhesion of a subsequently deposited diamond film.

As in the present fabrication, TiC is formed before diamond deposition and works as the interlayer due to the high carbon affinity of Ti. TiC plays a positive role in reducing the thermal stress due to lower thermal expansion coefficient of $7\times10^{-6}$/K than Ti of $9.5\times10^{-6}$/K. However, only 26% of the thermal stress can be reduced by this method, and performance of the TiC interlayer, e.g. morphology and thickness, may be changed by modifying the conditions of fabrication, and especially the substrate temperature as described herein. The TiC layer can be as thick as 150 μm or too thin to detect. It can be porous or with dense crystal shape. As noted above, a thick and porous TiC interlayer will definitely reduce adhesion of diamond film with the substrate.

Figure 2B:
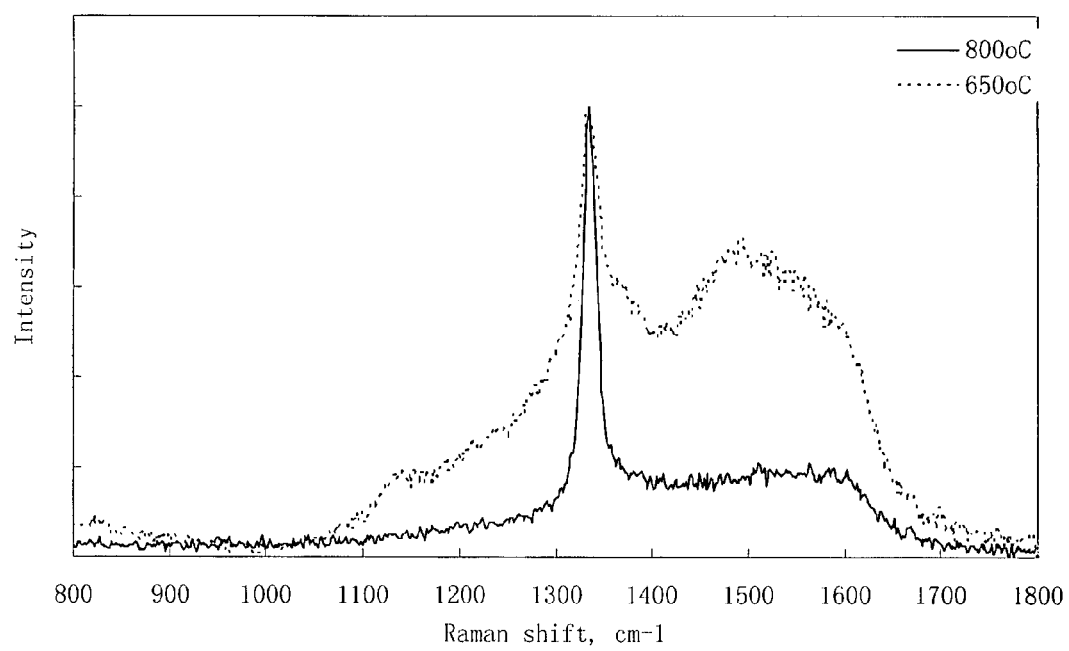
FIG. 2B is a Raman spectrum of the films of FIG. 2A.

While adhesion is essential for the usefulness and longevity of a diamond film electrode, the crystal quality of the superficial diamond layer also has a great influence on the overall electrochemical properties of the electrode. Unlike adhesion, which can be negatively affected by high-temperature deposition, crystal quality can in fact be negatively affected by low-temperature deposition. A high quality electrode requires high diamond crystal quality. Raman spectroscopy has been a powerful tool and a commonly used method in analysis of carbon films due to its ability to distinguish different bonding types and quantify the relative phase to each peak. Full-width-half-maximum (FWHM) value of a peak can show the crystallinity of the relative phase. The Raman peaks located at the center of 1332 cm$^{-1}$, 1550 cm$^{-1}$ and 1590 cm$^{-1}$ refer to diamond and nondiamond carbon, including graphite and amorphous carbon, respectively. FIG. 2B shows the Raman spectra, with A 514 nm line of an argon ion laser, for the electrodes of FIG. 2A, deposited at 650° C. and 800° C. These Raman spectra give the information about influence of the substrate temperature on the diamond crystal quality and crystallinity. When deposition occurred at 650° C., the deposited diamond possessed lower crystallinity and was mixed with larger amount of graphite and amorphous carbon as compared with deposition occurring at 800° C., as evidenced by the large FWHM for the peak corresponding to diamond, and the high peak intensity for the peak corresponding to the nondiamond carbon phase. Thus, deposition at 650° C. disadvantageously provides lower crystallinity and larger amount of graphite and amorphous carbon, as compared with deposition occurring at 800° C.

A stable diamond film electrode requires a superficial layer of diamond with high quality and high adhesion with the substrate. Under a high substrate temperature, high superficial diamond quality can be obtained, but the adhesion will be reduced due to the formation of a rough and porous carbide layer. Comparatively, under a low substrate temperature, high adhesion of the diamond layer with the substrate can be obtained due to the formation of a dense carbide buffer layer, but the crystal quality of the deposited diamond will be reduced. Therefore, the problem for using a high substrate temperature is the low working life time of the fabricated diamond film electrode, and the problem for the low substrate temperature is the low electrochemical performance.

Accordingly, the presently disclosed method result in a high quality top diamond layer, without sacrificing good adhesion with the substrate. The method integrates the advantages of the high and low substrate temperature deposition process. The high quality top diamond layer is fabricated under a high substrate temperature, and the adhesive interlayer is made under a low substrate temperature prior to the top layer formation process.

FIG. 2 shows a schematic diagram of the presently disclosed multi-stage deposition process. The substrate temperature is increased to the maximum value in a multi-stage mode. During the first stage, the substrate temperature is increased from the room temperature (RT) to the first stage temperature ($T_1$) in a set period of time ($ti_1$), and the substrate is kept at the first stage temperature ($T_1$) for a period of working time ($t_1$) while deposition occurs. Under the same working mode, the substrate temperature is then increased from the (n−1)th stage temperature to the n-th stage temperature ($T_n$) in a set period of time ($ti_n$), and the substrate is kept at the n-th stage temperature ($T_n$) for a period of working time ($t_n$) while further deposition occurs. The n value is from 2 to 10, the heating up time of $ti_n$ is in the range of 1 to 30 min, and the stable temperature time $t_n$ is in the range of 1 to 10 hour. Finally, the substrate is cooling down to the room temperature during the time of $t_f$ under a set cooling rate in the range of 0.5-10° C./min. During the deposition process, the chamber pressure is ideally kept in the range of 20-120 mbar, the gas flow rate in the range of 100-500 sccm, and the hydrocarbon gas to hydrogen gas ratio in the range of 0.3 vol %-3 vol %. Although in the above description deposition occurs only at stages of constant temperature ($t_1$ . . . $t_n$), in other aspects deposition may additionally occur during periods of temperature increase ($ti_1$ . . . $ti_n$).

Deposition performed according to the above description (and more generally to those methods disclosed herein) have successfully resulted in high quality diamond film coated objects. Due to the relatively low substrate temperatures during the initial deposition process, high adhesion of the diamond film with the substrate is achieved. During the early stages, under low substrate temperature, a dense carbide layer is coated on the metal substrate, and a layer of diamond and nondiamond carbon mixture covers the carbide layer. The dense carbide layer possesses high adhesion with the substrate and the mixture layer of diamond and nondaimond carbon, working as cement, can improve the adhesion with the coated diamond layer. Due to the relatively high substrate temperature during the final deposition process, the top diamond layer is fabricated with high quality. Low nondiamond carbon content is found in the diamond phase, which shows high crystallinity. The high quality diamond top layer possesses high electrochemical properties.

EXAMPLE

A specific sequence of steps performed in fabricating a diamond film electrode will now be described. The electrode was grown on a pure titanium substrate according to the presently disclosed multi-stage hot-filament chemical vapor deposition (HFCVD) method. In order to increase the conductivity, boron element was doped into the diamond film by adding boron containing chemicals into the gas phase.

In order to enhance the practical application, selection of a proper substrate material is important. Titanium is a preferred choice due to its relatively low price, high anti-corrosion and quick repassivation behavior, compared with silicon and some other valve metals, such as tantalum and niobium. However, in some circumstances it may be advantageous to use these and other valve metals, which may be used as substrates in any of the presently disclosed methods. A boron doped diamond film coated on titanium substrate (Ti/BDD) electrode has attracted much attention as one of the most ideal electrodes, especially when used as an anode.

Thus, in the present instance, ultrahigh pure hydrogen and methane gases were mixed and directed into a HFCVD reactor chamber. The gas flow rate was controlled by a mass flow controller, and the ratio of the hydrocarbon gas to hydrogen gas was adjusted by changing the gas flow rates. Trimethyl-Borate ($B(OCH_3)_3$) was used as a boron doping source, and Dimethyl-Methane ($CH_2(OCH_3)_2$) was added into the gas phase to promote diamond nucleation and growth process. The coil-shaped $\Phi$6 mm×35 mm filament was made with $\Phi$0.5 mm tantalum wire. The substrate was a Ti disk with dimension of $\Phi$12 mm×2 mm. The distance between the substrate and the center of the filament coil was kept at 9 mm. Substrate temperature and filament temperature were monitored by a thermal couple and an infrared thermometer, respectively.

In order to improve the adhesion of diamond film to substrates, diamond nucleation may be increased and interlayers may be built. Ultrasonic scratching of a substrate with a colloid of micro-sized diamond particles is an effective way to improve the nucleation rate, due to the high energy sites left on the surface after scratching with the high hardness particles. Thus, in the present instance, the Ti substrate was firstly treated with ultrasonic scratching using a diamond paste, a mixture of 1 gram of 1 μm sized diamond powder in 10 ml of acetone, for 30 minutes. Afterwards, the substrate was cleaned with an ultrasonic wash in de-ionized water for 5 minutes, to remove the diamond particles adhered on the sample surface. The optimal conditions were determined to be as follows, except for the substrate temperature: $CH_4$ in $H_2$ ratio=1%, $H_2$ gas flow rate=300 sccm, $T_{fil}$=2000-2300° C., and chamber pressure=40 mbar (see L. Guo et al, Diam. Relat. Mater. submitted).

The diamond film electrode was thus fabricated under a two-stage (N=2) method. During the deposition period, the $CH_4$ in $H_2$ ratio, $H_2$ gas flow rate, and chamber pressure were kept stable. The substrate temperature was kept at 650° C. ($T_1$) in the first stage and the working time was 5 hours ($t_1$). The substrate temperature in the second stage ($T_2$) was 750° C., and the working time ($t_2$) was 5 hours. For comparison purposes, another diamond film electrode was fabricated under a constant temperature condition (not according to the presently disclosed multi-stage method; $T_{sub}$=750° C.) for 10 hours.

Figure 3A:
FIG. 3A is a scanning electron microscope (SEM) image of the top surface micro-scale morphology of diamond film deposited according to a constant temperature method.
Figure 3B:
FIG. 3B is an SEM image of the top surface micro-scale morphology of diamond film deposited according to the present disclosure.

FIG. 3A and FIG. 3B show SEM images of top surface morphology of the diamond films. FIG. 3A shown an SEM image of a film deposited under a constant temperature condition, while FIG. 3B shows a film deposited under the presently-disclosed two-stage method. Although both of the two fabricated diamond films fully cover the substrate, they show an identifiably different morphology. The constant temperature diamond film of FIG. 3A shows clear cut faceted crystals with triangular and rectangular habits, and particle diameters in the range of 1-7 µm. Comparatively, the two-stage diamond film of FIG. 3B displays cubooctahedral facets, and crystal sizes in the range of 1-2 µm, with an overall larger amount of particles.

Figure 4:
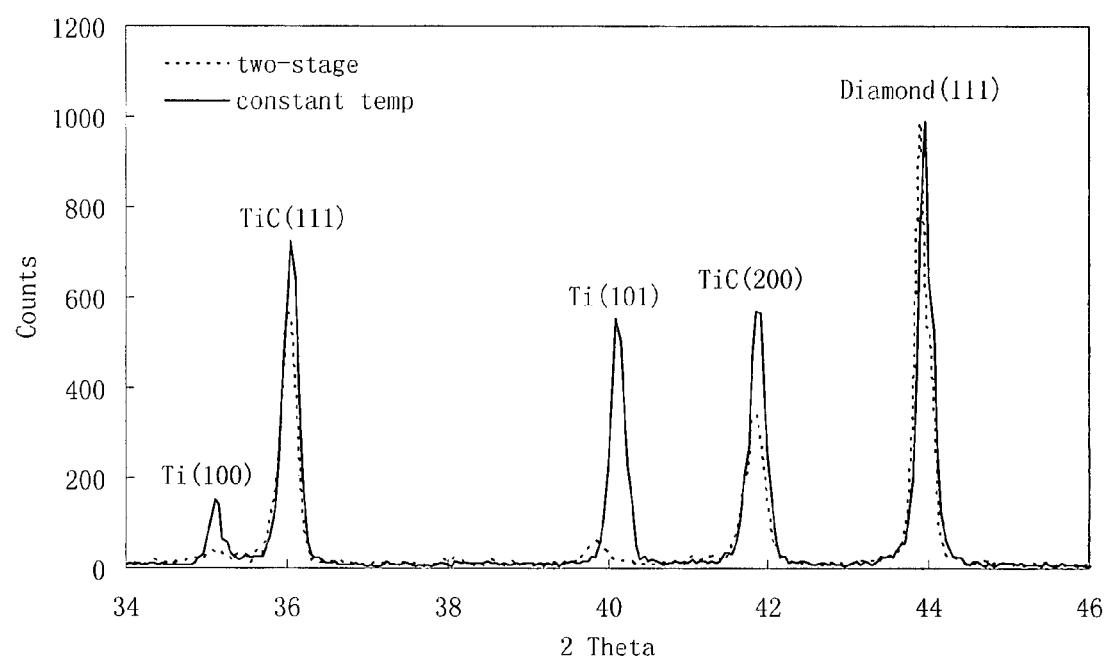
FIG. 4 is the superposition of two XRD patterns, one of a diamond film deposited according to a constant temperature method, and the other of a diamond film deposited according to the present disclosure.

FIG. 4 shows the superposition of two XRD patterns, one of a diamond film deposited according to a constant temperature method, and the other of a diamond film deposited according to the present disclosure. XRD results showed that both of the two diamond films are preferentially oriented at (111). The normalized XRD profile according to the diamond (111) peak indicates that the two-stage BDD electrode, fabricated according to the present disclosure, obtained a lower intensity of the titanium carbide (TiC) phase than did the electrode fabricated according to a constant temperature method. The TiC phase became porous and rough at high substrate temperature, but changed into dense and thin at comparatively low temperature. However, high temperature was expected to improve the diamond purity compared to low temperature.

Figure 5:
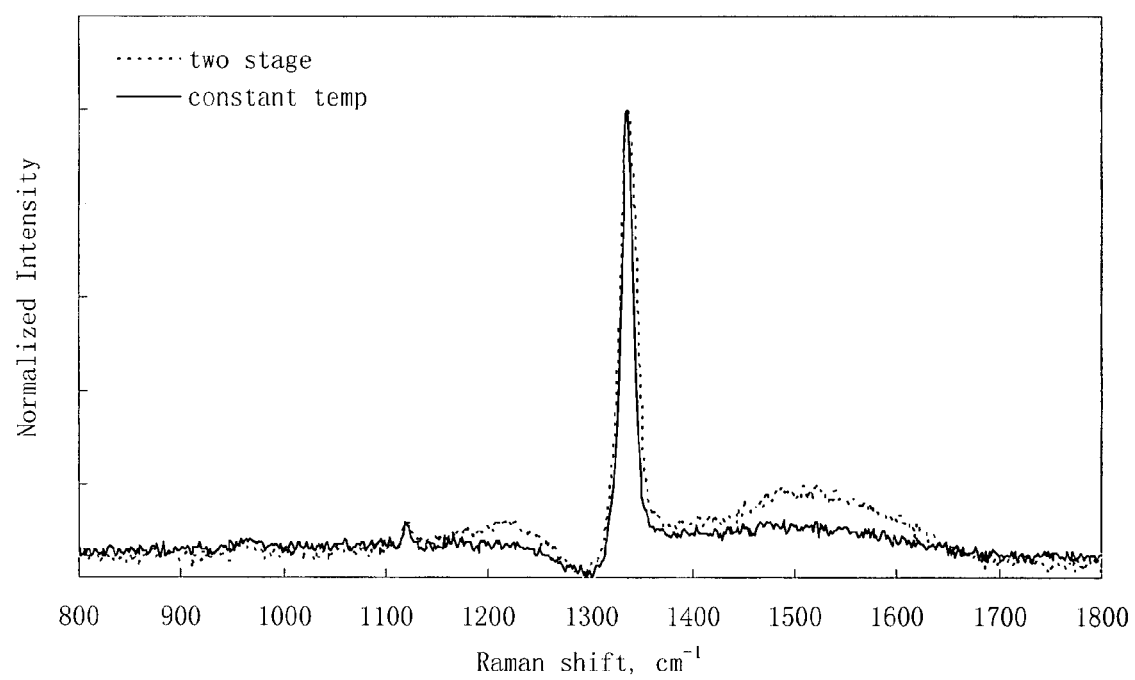
FIG. 5 is the superposition of two Raman spectra, one of a diamond film deposited according to a constant temperature method, and the other of a diamond film deposited according to the present disclosure.

FIG. 5 shows the superposition of two Raman spectra with 514 nm line of an argon ion laser, one of a diamond film deposited according to a constant temperature method, and the other of a diamond film deposited according to the present disclosure. The normalized micro-Raman spectral data for constant temperature and two-stage diamond film electrodes may be seen. The FWHM of the diamond peak for films deposited according to the constant temperature and two-stage methods were 14.6 $cm^{-1}$ and 18.5 $cm^{-1}$, respectively. Due to the smaller crystal size and higher defect density, crystallinity of the two-stage diamond film (manufactured according to the present disclosure) was observed to be lower than the crystallinity of the constant temperature film. Moreover, according to the peak intensity, it can be seen that the diamond $sp^3$ carbon percentage in the total carbon content was 98.4% and 98% for the constant temperature and two-stage diamond films, respectively. The slightly higher $sp^2$ carbon concentration, as opposed to the $sp^3$ concentration, is believed to have resulted from the larger boundary area in the two-stage sample.

Electrode stability was tested, both for the electrode fabricated according to the presently disclosed two-stage method, and for the electrode fabricated according to a constant temperature method. Each diamond film electrode was subjected to an accelerated life test, in which the electrode was anodically polarized under galvanostatic condition with a current density of 1 $A/cm^2$ in 3M $H_2SO_4$ solution. It is noted that these are extreme conditions, and the real service life of either electrode would be much longer under normal operation conditions. All chemicals were commercial analytical grade and the solution was prepared with ultrapure deionized water (17.9 MΩcm). The accelerated life end-point was deemed to have been reached when a sharp increase in the voltage, 5 volts, was observed. This point is also taken as the point of electrode failure, believed to be mainly due to film delamination. The working lives of the constant temperature electrode and the two-stage electrode, respectively, were 244 hours and 804 hours. The constant temperature electrode, which failed earlier, was analyzed and deemed to have many more sites where the diamond film split away than the two-stage electrode.

Figure 6A:
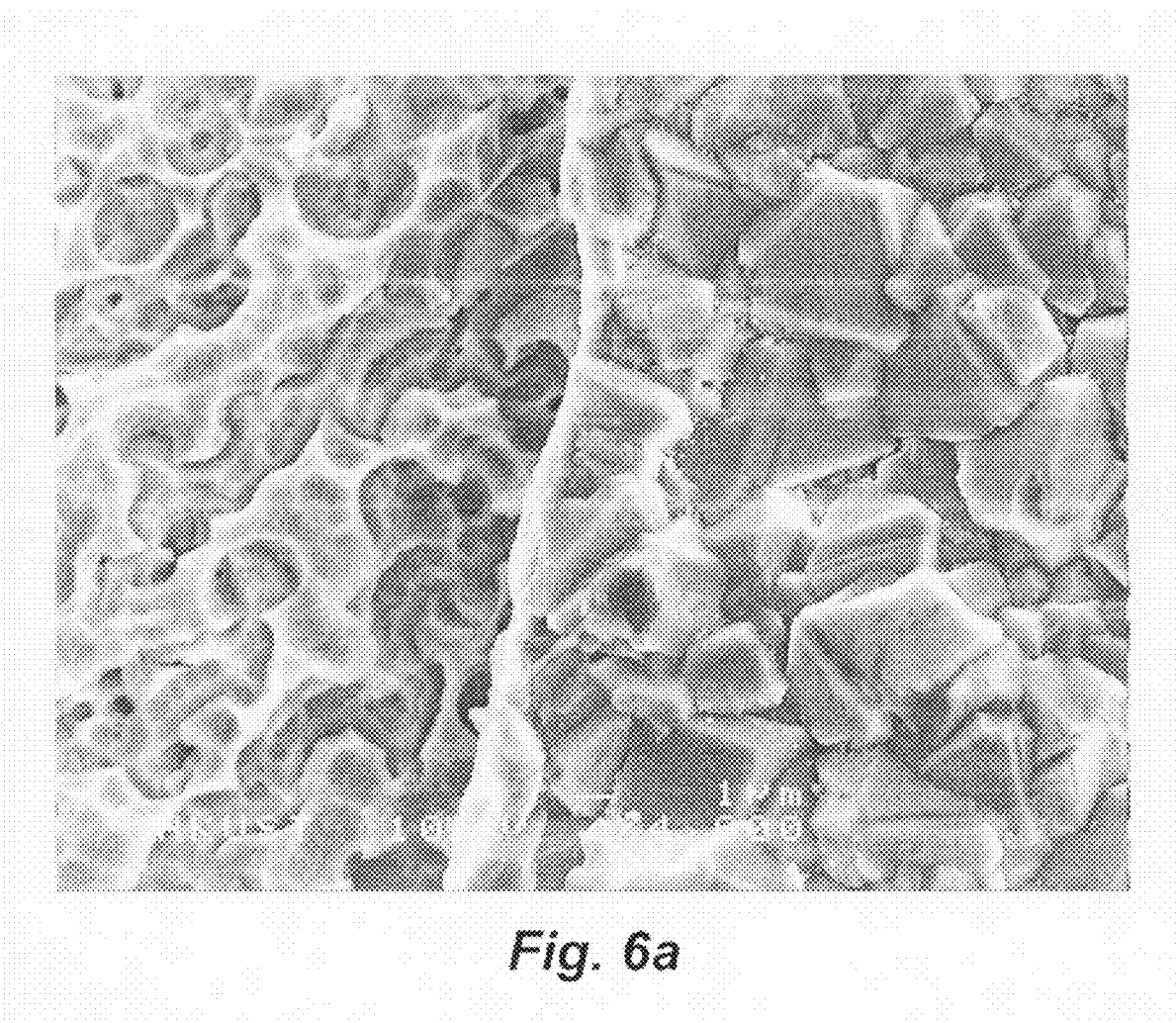
FIG. 6A is an SEM image of the surface morphology of an electrode after an accelerated life test. The electrode had a diamond film which was deposited according to a constant temperature method.
Figure 6B:
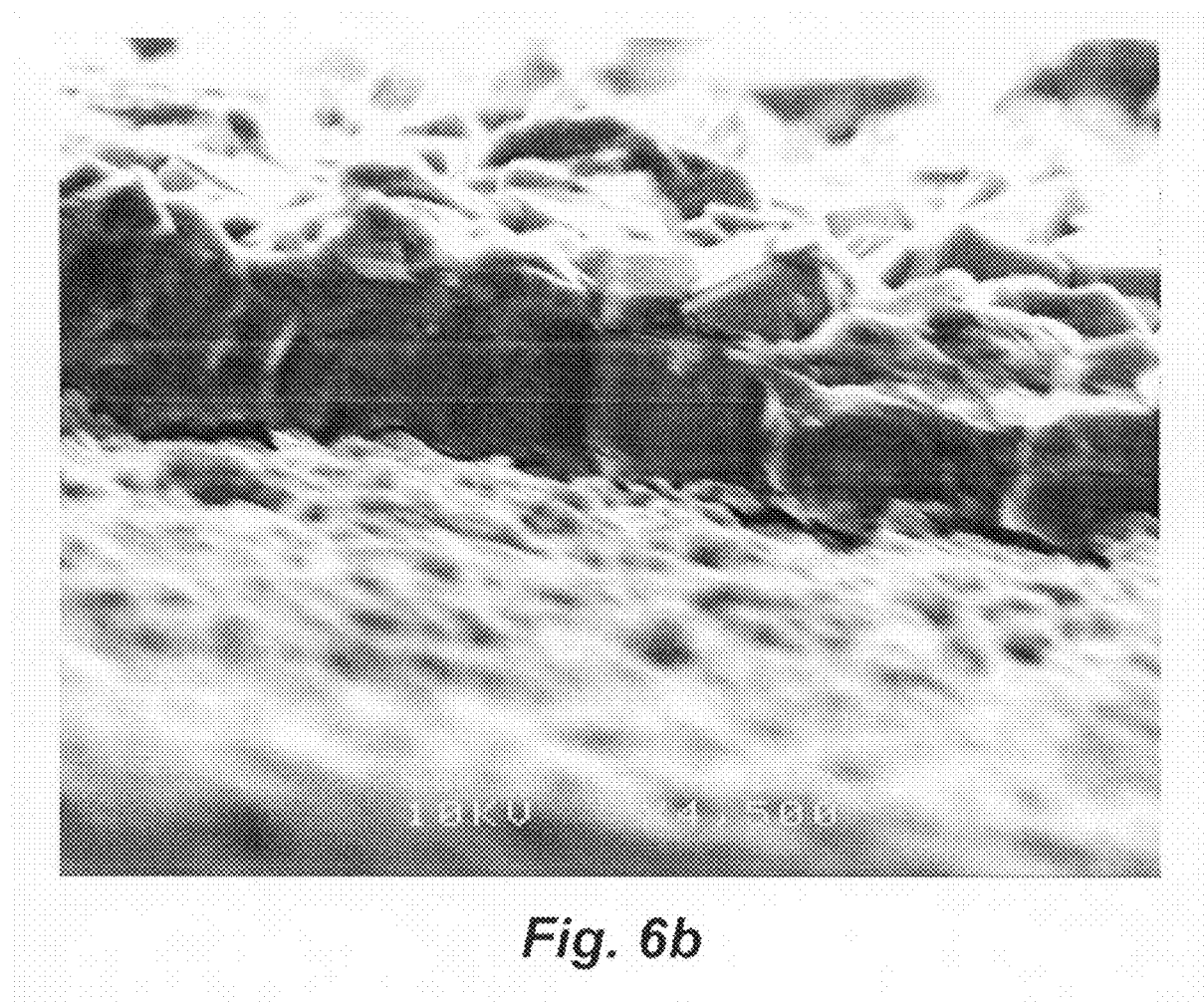
FIG. 6B is a cross-sectional view of the electrode of FIG. 6A.

FIG. 6A shows the top surface morphology of this failed electrode, manufactured according to the constant-temperature method. The cracks propagated through the diamond crystals, which is believed to have resulted from high residual stress in the film. As suspected, the exposed substrate showed a rough and porous morphology. According to FIG. 6B, a cross-sectional view of the electrode of FIG. 6A, void space sites may be seen between the diamond film and the substrate.

Figure 7A:
FIG. 7A is an SEM image of the surface morphology of an electrode after an accelerated life test. The electrode had a diamond film which was deposited according to the present disclosure.
Figure 7B:
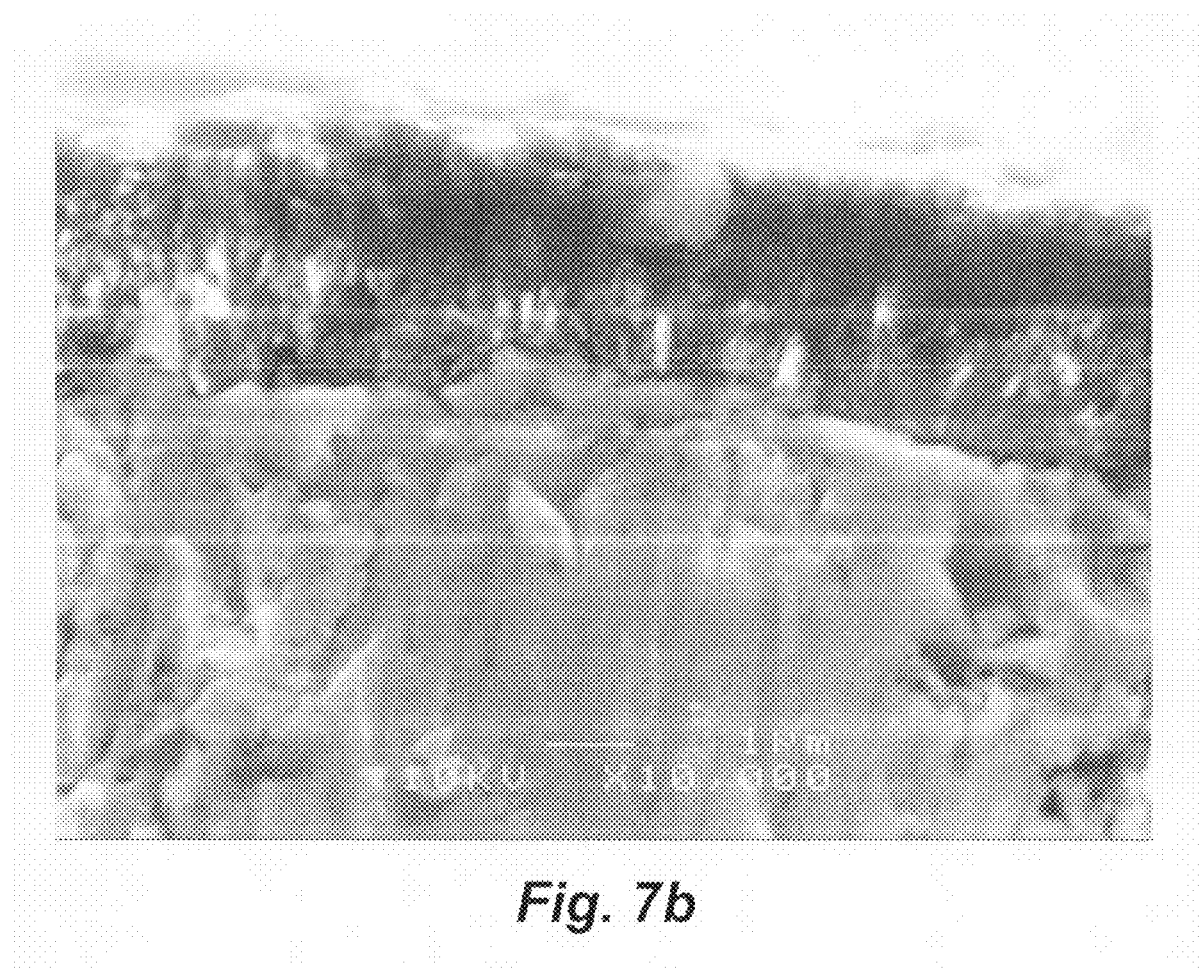
FIG. 7B is a cross-sectional view of the electrode of FIG. 7A.

In contrast, FIG. 7A and FIG. 7B show the top surface morphology and cross sectional view of the electrode manufactured according to the present disclosure. Here, a three layer structure can be seen on the broken site, and the substrate on the bottom is seen to be much more dense than in the electrode manufactured according to the constant-temperature method. In FIG. 7B, no visible void space can be observed at the interface.

Three factors are believed to cause diamond film delamination: electrochemical corrosion, mechanical force on the diamond film due to the gas bubble evolution under serious polarization in severe environment, and residual stress left in the as-deposited film. The above delamination is believed to have arisen from the latter two sources. This is because diamond crystal, which is very stable under various severe conditions, is calculated to have a corrosion rate in 3M $H_2SO_4$ of 7.7×$10^{-4}$ µm/hr, according to electrochemical polarization measurements and extrapolations in the Tafel regime. Since the thickness of the above sample formed according to the presently disclosed two-stage method is 2 µm, and that of the sample formed at constant temperature is 5 µm, with the calculated corrosion rate no diamond film spallation should be visible after the mentioned accelerated life test period. Thus, mechanical force due to gas bubble evolution and residual stress in the film should be the main reasons for failure. As mentioned in the background information, residual stress itself in the film mainly comes from two sources: (a) strain mismatch due to the difference of lattice constants of substrate and thin film; (b) thermal stress for the different thermal expansion coefficients of substrate and thin film.

Figure 8A:
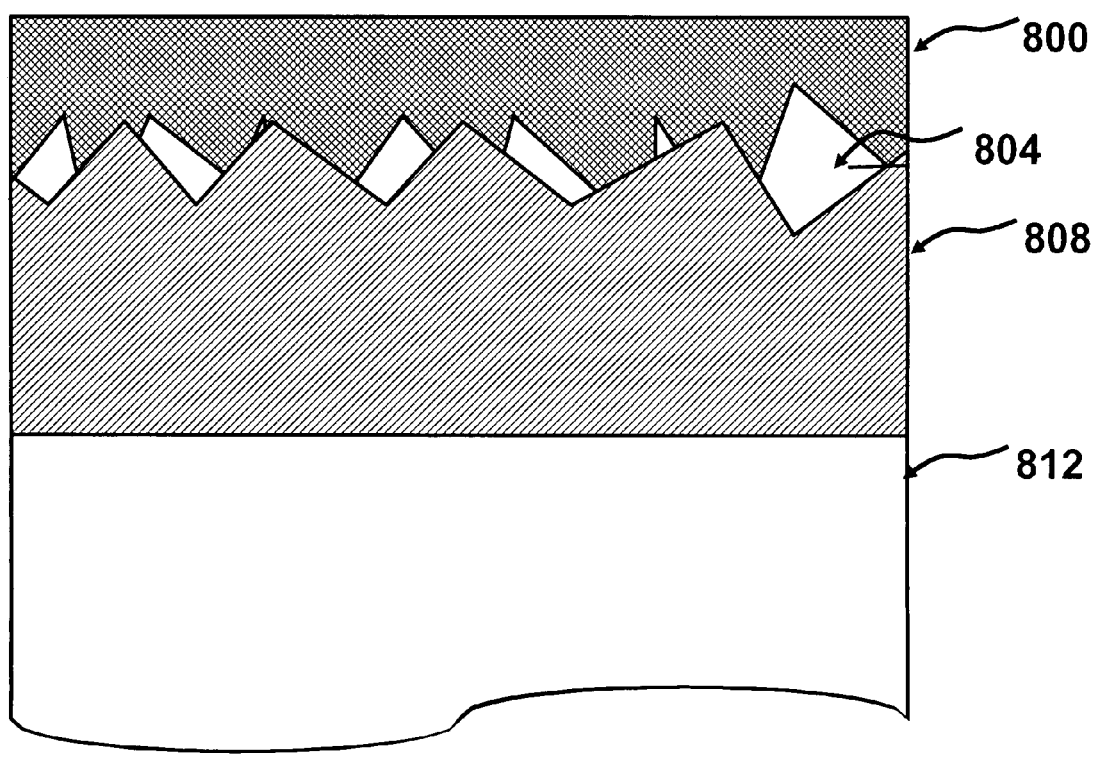
FIG. 8A is an illustration of a multilayer model of diamond film deposited on a substrate according to a constant temperature method.
Figure 8B:
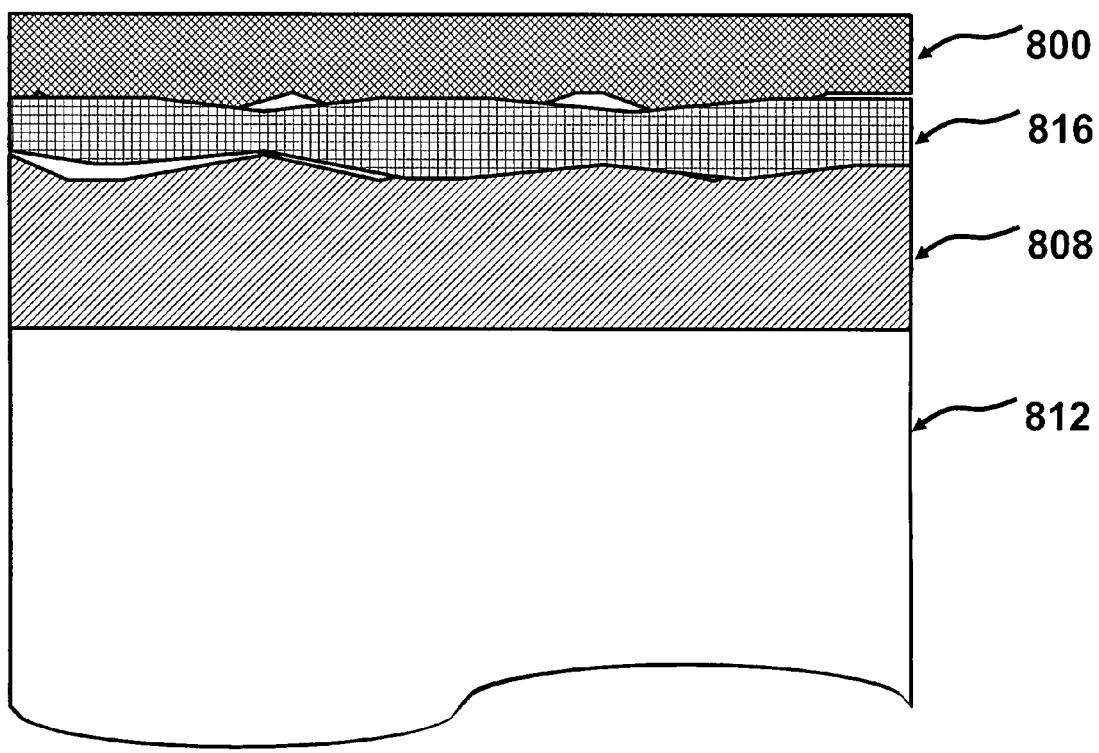
FIG. 8B is an illustration of a multilayer model of diamond film deposited on a substrate in two stages according to the present disclosure.

FIG. 8A schematically illustrates a multilayer model of a diamond film deposited on a substrate according to a constant temperature method, while FIG. 8B schematically illustrates a multilayer model of a diamond film deposited on a substrate according to the present disclosure, in two stages. These illustrate what was determined through additional SEM, XRD and Raman analysis, namely, that in FIG. 8B a continuous carbon compositionally graded multilayer structure of Ti (element 812)/TiC (element 808)/(Diamond+Amorphous Carbon) (element 816)/Diamond (element 800) was formed in the two-stage sample, while only a structure of Ti (element 812)/TiC (element 808)/Diamond (element 800) was formed in the constant temperature sample. For the two-stage sample, the buffer layer of a diamond mixture with amorphous carbon is believed to have reduced the thermal stress and the strain mismatch between the TiC and the diamond layer, and to have provided much lower residual stress in the two-stage sample. Furthermore, the nature of TiC as the interlayer was believed to have influenced the adhesion of the diamond film thereto, and not just adhesion of the interlayer to the substrate. A dense TiC buffer layer was observed, as illustrated here in FIG. 8B, and is believed to have lead to small voids both between buffer and substrate, and between buffer and superficial layer. In contrast, and as illustrated in FIG. 8A, the constant-temperature model was observed to leave large voids (element 804) between the diamond and TiC. Thus, the adhesion of the deposited diamond layer on the substrate was improved in multiple ways through the use of a multi-stage deposition process as presently disclosed.

Although the above disclosure is drawn to electrodes, the disclosed methods may be applied in other areas where diamond coating is desired or advantageous. Thus, the present methods are useful not only in the fabrication of electrodes such as those used in electrolysis for wastewater treatment, and in the electrochemical analysis of pollutants in water. As a non-limiting example, the substrate and the diamond film may together form a tooth or blade configured for use in a cutting tool, where high external stress and internal temperature fluctuations lead to delamination, and thus where the improved adhesive properties disclosed herein may be advantageous.

Also, although the above disclosure is drawn to two stage processes, the same benefits conferred by a two-step deposition process may be achieved in a process of three, four, or even more stages. As non-limiting examples, three or more deposition stages at successively higher temperatures can provide more layers of diamond and amorphous carbon at varying ratios, smoothing the transition between layers and further reducing delamination. Similarly, the use of three or more deposition stages can allow the final stage to occur at even higher temperatures than those described herein, and thus provide better superficial qualities, without jeopardizing the adhesion to the underlying layer. Thus, the present disclosure is not limited to two-stage deposition, but is directed to multi-stage deposition generally, as shown, described, and claimed.

The previous description of some aspects is provided to enable any person skilled in the art to make or use the presently disclosed methods and apparatuses. Various modifications to these aspects will be readily apparent to those skilled in the art, and the generic principles defined herein may be applied to other aspects without departing from the spirit or scope of the invention. For example, one or more elements can be rearranged and/or combined, or additional elements may be added. Thus, the present invention is not intended to be limited to the aspects shown herein but is to be accorded the widest scope consistent with the principles and novel features disclosed herein.

What is claimed is:

1. A method of depositing a stable diamond film, the method comprising:
    providing a metal substrate;
    pretreating a surface of the substrate and then
    placing the substrate in a reaction chamber;
    depositing a diamond film on the substrate by way of an N-stage chemical vapor deposition to form a stable composite comprising the diamond film on the substrate, the depositing step comprising:
       increasing the substrate temperature from a starting temperature (ST) to a first stage temperature ($T_1$) in a set period of time ($ti_1$),
       keeping the substrate at the first stage temperature ($T_1$) for a period of working time ($t_1$) while at least diamond is deposited on the pretreated surface of the substrate,
       then for each n-th stage of N–1 subsequent further stages,
          further increasing the substrate temperature to an n-th stage temperature ($T_n$) in a further set period of time ($ti_n$); and
          further keeping the substrate at the n-th stage temperature ($T_n$) for a further period of working time ($t_n$) while at least diamond is deposited; and then
       cooling the substrate and the diamond film during a period of cooling time ($t_f$), the stable composite comprising the substrate and the diamond film,
    wherein N, the number of stages, is selected from the range of 3 to 10, wherein n, the stage index, increases from 3 to N,
    wherein $T_1$ and $t_1$ are together selected to produce a dense, thin distribution of a carbide of metal of the metal substrate,
    wherein $T_N$ and $t_N$ corresponding to the final, Nth, stage are together selected to produce a diamond layer having a crystal size of less than 2 μm,
    and wherein a $T_n$ and a $t_n$ are together selected to produce a layer of diamond and nondiamond carbon which adhesively joins the carbide layer with superficial diamond.

2. The method of claim 1, wherein each time $ti_n$ is selected from the range of about 1 to 30 minutes, and each time $t_n$ is selected from the range of about 1 to 10 hours.

3. The method of claim 1, wherein each substrate temperature $T_n$ is selected from the range of about 300~1000° C., and the temperature difference between each temperature $T_n$ and its subsequent temperature $T_{n+1}$ is selected from the range of about 50-300° C.

4. The method of claim 1, wherein the cooling occurs at a cooling rate ranging from about 0.5-10° C./min.

5. The method of claim 1, wherein reaction chamber pressure is kept in the range of about 20-120 mbar, gas flow rate in the reaction chamber is kept in the range of about 100-500 SCCM, and a ratio hydrocarbon gas such as $CH_4$ to hydrogen gas kept in the range of about 0.3%-3 vol %.

6. The method of claim 1, wherein the substrate is selected from the group consisting of: titanium, titanium alloy, and combinations thereof.

7. The method of claim 1, wherein the substrate is a valve metal.

8. The method of claim 1, wherein the pretreatment process is selected from the group consisting of: polishing, ultrasonic scratching with a diamond paste, surface cleaning, ultrasonic washing, and combinations thereof.

9. The method of claim 1, wherein at least some of the diamond deposited on the film is doped with boron.

10. The method of claim 1, wherein the depositing step is performed by way of hot-filament chemical vapor deposition.

11. The method of claim 1, wherein the substrate and the diamond film together form an electrode.

12. The method of claim 1, wherein the substrate and the diamond film together form a tooth or blade configured for use in a cutting tool.

13. The method of claim 1, wherein
    the metal substrate comprises titanium,
    the starting temperature ST is room temperature,
    $T_1$ is about 650° C., $t_1$ is about 5 hours, and in another stage, $T_n$ is about 750° C., $t_n$ is about 5 hours, and
    the depositing step is performed by way of hot-filament chemical vapor deposition.

* * * * *

UNITED STATES PATENT AND TRADEMARK OFFICE
CERTIFICATE OF CORRECTION

| | | |
|---|---|---|
| PATENT NO. | : 7,833,581 B2 | Page 1 of 1 |
| APPLICATION NO. | : 11/898112 | |
| DATED | : November 16, 2010 | |
| INVENTOR(S) | : Liang Guo et al. | |

It is certified that error appears in the above-identified patent and that said Letters Patent is hereby corrected as shown below:

Column 12, Claim 4, Line 31
Please delete "ranging from about 0.5-10° C./min."
and replace with -- ranging from about 0.5 - 10°C/min. --

Column 12, Claim 5, Line 36
Please delete "0.3%-3 vol %."
and replace with -- 0.3vol% - 3vol%. --

Column 12, Claim 13, Lines 58-59
Please delete "$T_1$ is about 650°C., $t_1$ is about 5 hours, and in another stage, $T_n$ is about 750° C., $t_n$ is about 5 hours, and"
and replace with -- $T_1$ is about 650°C, $t_1$ is about 5 hours, and in another stage, $T_n$ is about 750°C, $t_n$ is about 5 hours, and --

Signed and Sealed this
Eleventh Day of January, 2011

David J. Kappos
*Director of the United States Patent and Trademark Office*